(12) United States Patent
Kim et al.

(10) Patent No.: US 6,855,629 B2
(45) Date of Patent: Feb. 15, 2005

(54) METHOD FOR FORMING A DUAL DAMASCENE WIRING PATTERN IN A SEMICONDUCTOR DEVICE

(75) Inventors: Jae-Hak Kim, Seoul (KR); Soo-Geun Lee, Suwon (KR); Wan-Jae Park, Suwon (KR); Kyoung-Woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/437,529

(22) Filed: May 14, 2003

(65) Prior Publication Data

US 2004/0018721 A1 Jan. 29, 2004

(30) Foreign Application Priority Data

Jul. 24, 2002 (KR) ......................................... 2002-43477

(51) Int. Cl.[7] ........................................... H01L 21/4763
(52) U.S. Cl. ........................... 438/637; 438/618; 438/636
(58) Field of Search .................................. 438/637, 618

(56) References Cited

U.S. PATENT DOCUMENTS

| | | | |
|---|---|---|---|
| 5,989,997 A | 11/1999 | Lin et al. ..................... | 438/622 |
| 6,057,239 A | 5/2000 | Wang et al. .................. | 438/689 |
| 6,093,966 A | 7/2000 | Venkatraman et al. ....... | 257/751 |
| 6,221,759 B1 | 4/2001 | Bothra et al. ................ | 438/627 |
| 6,319,815 B1 | 11/2001 | Iguchi et al. ................. | 438/624 |
| 6,323,121 B1 | 11/2001 | Liu et al. ...................... | 438/633 |
| 6,352,945 B1 | 3/2002 | Matsuki et al. .............. | 438/778 |
| 6,383,955 B1 | 5/2002 | Matsuki ....................... | 438/790 |
| 6,391,761 B1 | 5/2002 | Lui ............................... | 438/618 |
| 6,410,463 B1 | 6/2002 | Matsuki ....................... | 438/790 |
| 6,432,846 B1 | 8/2002 | Matsuki ....................... | 438/790 |
| 6,455,445 B2 | 9/2002 | Matsuki ....................... | 438/789 |
| 6,458,705 B1 * | 10/2002 | Hung et al. .................. | 438/692 |
| 6,461,955 B1 * | 10/2002 | Tsu et al. ...................... | 438/618 |
| 6,465,358 B1 | 10/2002 | Nashner et al. .............. | 438/700 |
| 6,509,267 B1 * | 1/2003 | Woo et al. .................... | 438/687 |
| 6,514,880 B2 | 2/2003 | Matsuki et al. .............. | 438/780 |
| 6,559,520 B2 | 5/2003 | Matsuki et al. .............. | 257/642 |
| 2001/0046778 A1 | 11/2001 | Wang et al. .................. | 438/706 |
| 2002/0009873 A1 * | 1/2002 | Usami ........................... | 438/620 |

FOREIGN PATENT DOCUMENTS

| | | | |
|---|---|---|---|
| KR | 0029195 | 5/2000 | ............ C09K/3/10 |
| KR | 10-0364053 | 11/2002 | ........... H01L/21/31 |

OTHER PUBLICATIONS

S.Wolf and R.N. Tauber, Silicon Processing, Lattice Press, vol. 1, p. 171.*
Jiang, P, et al., Trench Etch Processes for Dual Damascene Patterning of Low–k Dielectrics, J. Vac. Sci. Technol. A 19(4), Jul./Aug. 2001, pp. 1388–1391.

* cited by examiner

*Primary Examiner*—Hoai Ho
*Assistant Examiner*—Thao P. Le
(74) *Attorney, Agent, or Firm*—Mills & Onello LLP

(57) ABSTRACT

In a method for forming a dual damascene wiring pattern, an etch stop film and an interlayer dielectric film comprising an SiOC:H group material are formed on a substrate having an electrical connection layer formed thereon. An anti-reflection layer is formed on the interlayer dielectric film. A primary opening is formed by etching the anti-reflection layer and the interlayer dielectric film to expose a surface of the etch stop film. A sacrificial film is formed comprising a low dielectric constant material in the primary opening and on the anti-reflection layer. A trench photoresist pattern having a width larger than that of the primary opening is formed on the sacrificial film after plasma-processing the sacrificial film. The sacrificial film, the anti-reflection layer and the interlayer dielectric film are sequentially etched using the trench photoresist pattern as an etch mask so as to form a secondary opening of a trench shape, and the trench photoresist pattern is removed, said secondary opening extending from an upper portion of the primary opening. The sacrificial film remaining is removed, the exposed etch stop film and anti-reflection layer are removed, the primary and secondary openings are filled with metal so as to be electrically coupled with the electrical connection layer. In this manner, damage to the etch stop layer is mitigated or eliminated during processing.

18 Claims, 18 Drawing Sheets

METHOD FOR FORMING A DUAL DAMASCENE WIRING PATTERN IN A SEMICONDUCTOR DEVICE

BACKGROUND OF THE INVENTION

1. Field of the Invention

The present invention relates to a semiconductor device fabrication process; and more particularly, to a method of forming a dual damascene wiring pattern.

2. Prior Art of the Invention

Wiring structures using a dual damascene configuration in deep sub-micron integrated circuit devices have become widespread in use. FIGS. 1A through 1E are sectional views illustrating a universally popular dual damascene process.

Referring to FIG. 1A, in a via photolithography process, a copper layer 20 as an electric connection layer is formed on a portion of an upper surface of a substrate 10 on which semiconductor devices are formed. An etch stop film 30 and an interlayer dielectric film ILD 40 of the SiOC:H group are formed on the substrate 10 and the copper layer 20. On the interlayer dielectric film 40 a photoresist is deposited, and a photolithographic process for forming a via hole having a predetermined size D1 is executed. During the photolithographic process, a photoresist pattern 50 is formed as shown in FIG. 1A. A dry etch is performed on the resultant structure of FIG. 1A to form a via hole 60 as a primary opening as shown in FIG. 1B. The residual photoresist 50 used as an etch mask is removed by an ashing process after the completion of the via etch process.

FIG. 1C represents a trench photolithography process of forming a secondary opening having a width D2 larger than that of the via hole 60 of FIG. 1B. FIG. 1D illustrates a trench etch process that follows the trench photo process. As a result, the openings 60, 80 having two different widths are formed in the ILD 40 body. After executing the process of FIG. 1D, an ashing process is performed to achieve the resulting dual damascene structure shown in FIG. 1E.

In the conventional dual damascene process, the size of the primary via opening 60 is preserved, even in the case where a misalignment occurs during the photo process of FIG. 1C for forming the trench 80 that is executed following the etch of the via hole. However, in the case where a SiOC:H group material is used for the interlayer dielectric film ILD 40, the etch stop film 30, or etch stopper 30, formed under the interlayer dielectric 40 can become seriously damaged during the via etch process. The major cause for the serious damage of the etch stop film 30 is raised by a comparatively lower etch selection rate between the interlayer dielectric film 40 and the etch stop film 30. In the case where the etch stop film 30, made of SiN or SiC etc., is etched excessively, the copper layer 20 that provides an electrical connection layer formed under the etch stop layer 30 is influenced by the etch damage. Further, in the case where the photoresist inside the via hole inside is not completely eliminated in the trench photo process following the via etch process, a "fence" can be generated following the trench etch process, owing to photoresist material that remains within the via hole. Such etching damage and the fence adversely affect production yield and resulting device reliability. Meanwhile, in the trench photoresist coating process following the via etch, a phenomenon can occur that results in a photoresist coating thickness that is not uniform as a result of via density. In such a case, the condition of the photo process is changed, to thus cause partial pattern inferiority.

In the conventional process recently developed to address the above problems, as shown in FIGS. 2A through 2F, a method has become popular that involves forming a bottom anti-reflection coating (BARC) film 65 is filled into the via hole 60 partially or completely and an etch back process is then performed. The steps of FIGS. 2A through 2F excepting FIG. 2C are the same as FIGS. 1A through 1E in their processes. FIG. 2C shows the structure following introduction of the BARC film 65.

The BARC film 65 protects the etch stop film 30 as the etch stopper when executing the trench etch. The conventional approach shown in FIGS. 2A through 2F however introduces the additional problem that photo margin becomes very small in the following trench photo patterning process due to the height of the BARC film 65 in the via hole 60. If the height of the BARC film 65 is increased in order to improve the photo margin, the fence problem can still occur after the trench etch process.

SUMMARY OF THE INVENTION

It is therefore an object of the present invention to provide a method of forming a wiring structure in a semiconductor device, while avoiding the limitations of the conventional approaches discussed above.

Another object of the present invention is to provide an improved method of forming a dual damascene wiring pattern in a semiconductor device.

Another object of the present invention is to provide a method of preventing or minimizing damage to an etch stop layer in the case where an SiOC:H material group having a low dielectric constant is employed as an interlayer dielectric film in the formation of a dual damascene wiring pattern.

A further object of the present invention is to provide a method of forming a dual damascene wiring pattern, which is capable of smoothly executing a photolithography process by using a sacrificial film formed of lower dielectric constant material.

An additional object of the present invention is to provide a method for effectively eliminating sacrificial film remaining following trench etch, in forming a dual damascene wiring pattern by using the sacrificial film made of low dielectric constant material.

In accordance with one aspect of the present invention, in a method for forming a dual damascene wiring pattern, an etch stop film and an interlayer dielectric film comprising an SiOC:H group material are formed on a substrate having an electrical connection layer formed thereon. An anti-reflection layer Is formed on the interlayer dielectric film. A primary opening s formed by etching the anti-reflection layer and the interlayer dielectric film to expose a surface of the etch stop film. A sacrificial film is formed comprising a low dielectric constant material in the primary opening and on the anti-reflection layer. A trench photoresist pattern having a width larger than that of the primary opening is formed on the sacrificial film after plasma-processing the sacrificial film. The sacrificial film, the anti-reflection layer and the interlayer dielectric film are sequentially etched using the trench photoresist pattern as an etch mask so as to form a secondary opening of a trench shape, and the trench photoresist pattern is removed, said secondary opening extending from an upper portion of the primary opening. The sacrificial film remaining is removed, the exposed etch stop film and anti-reflection layer are removed, the primary and secondary openings are filled with metal so as to be electrically coupled with the electrical connection layer. In this manner, damage to the etch stop layer is mitigated or eliminated during processing.

In accordance with another aspect of the present invention, in a method for forming a dual damascene wiring pattern, an etch stop film and an interlayer dielectric film comprising an SiOC:H group material are formed on a substrate having an electrical connection layer formed thereon. An anti-reflection layer Is formed on the interlayer dielectric film. A primary opening s formed by etching the anti-reflection layer and the interlayer dielectric film to expose a surface of the etch stop film. A sacrificial film is formed comprising a low dielectric constant material in the primary opening and on the anti-reflection layer. A capping thin film is formed on the sacrificial film and a trench photoresist pattern having a width larger than that of the primary opening is formed on the capping thin film. The capping thin film, the sacrificial film, the anti-reflection layer and the interlayer dielectric film are sequentially etched using the trench photoresist pattern as an etch mask so as to form a secondary opening of a trench shape, and the trench photoresist pattern is removed, said secondary opening extending from an upper portion of the primary opening. The capping thin film and sacrificial film remaining are removed, the exposed etch stop film and anti-reflection layer are removed, the primary and secondary openings are filled with metal so as to be electrically coupled with the electrical connection layer. In this manner, damage to the etch stop layer is mitigated or eliminated during processing.

In accordance with another aspect of the present invention, in a method for forming a dual damascene wiring pattern, an etch stop film and an interlayer dielectric film comprising an SiOC:H group material are formed on a substrate having an electrical connection layer formed thereon. An anti-reflection layer Is formed on the interlayer dielectric film. A primary opening s formed by etching the anti-reflection layer and the interlayer dielectric film to expose a surface of the etch stop film. A sacrificial film is formed comprising a low dielectric constant material in the primary opening and on the anti-reflection layer. An anti-reflection coating film is formed on the sacrificial film and a trench photoresist pattern having a width larger than that of the primary opening is formed on the anti-reflection coating film. The anti-reflection coating film, the sacrificial film, the anti-reflection layer and the interlayer dielectric film are sequentially etched using the trench photoresist pattern as an etch mask so as to form a secondary opening of a trench shape, and the trench photoresist pattern is removed, said secondary opening extending from an upper portion of the primary opening. The anti-reflection coating film and sacrificial film remaining are removed, the exposed etch stop film and anti-reflection layer are removed, the primary and secondary openings are filled with metal so as to be electrically coupled with the electrical connection layer. In this manner, damage to the etch stop layer is mitigated or eliminated during processing.

The process of removing the sacrificial film is preferably executed by a dry etch back process. The electrical connection layer is preferably made of copper. The sacrificial film comprises, for example, hydrogen silsesquioxane(HSQ), methyl silsesquioxane(MSQ) or benzocyclobutene. In the plasma-process of the sacrificial film, a mixed gas including at least one of oxygen, nitrogen, ammonia, helium and hydrogen can be used as plasma source gas. The etch stop film can be made of SiC or SiN, and the anti-reflection layer can be made of SiC or SiON.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

Hereinafter, preferred embodiments of the present invention will be described in detail with reference to the accompanying drawings.

In accordance with an inventive method of forming a dual damascene wiring pattern, in respective drawings the same or similar functions are provided with the same referential characters or numbers. It will be noted in the present invention that forming a second layer on a first layer means not only that the second layer is formed directly on the first layer, but also that some material layer may be interposed between the first and second layers.

Figure 1A:
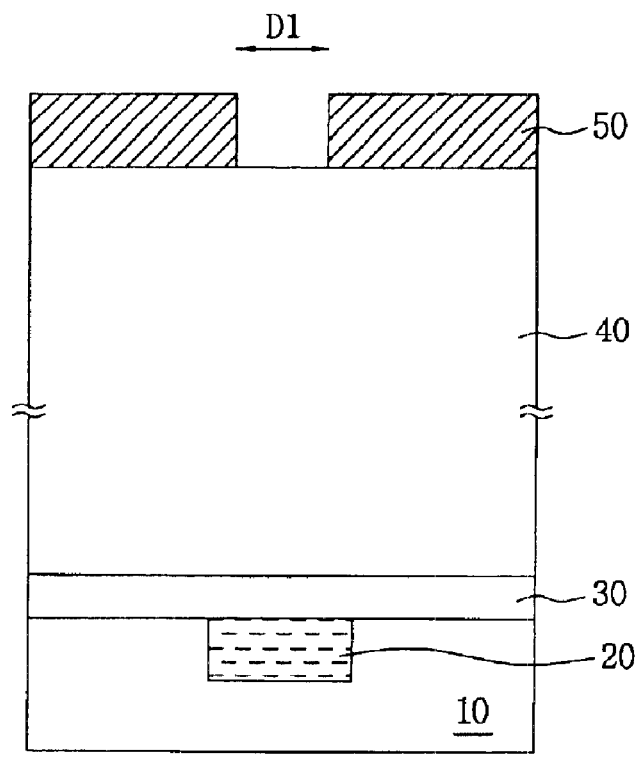
FIGS. 1A to 1E are sectional views of a conventional dual damascene process.
Figure 1B:
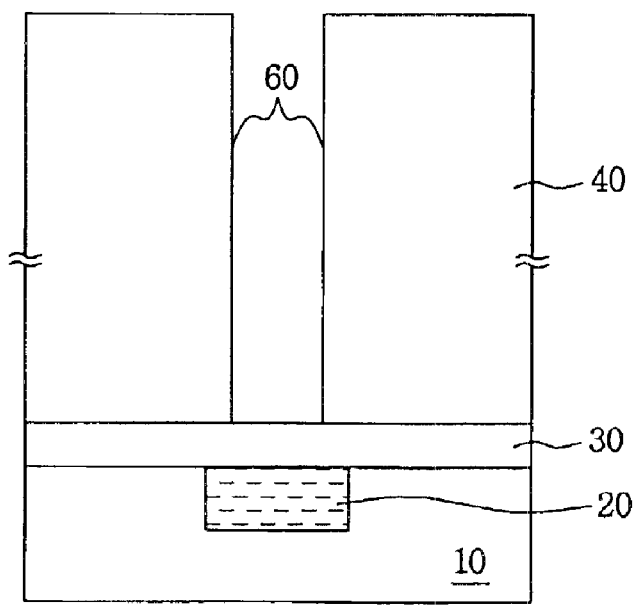
Figure 1C:
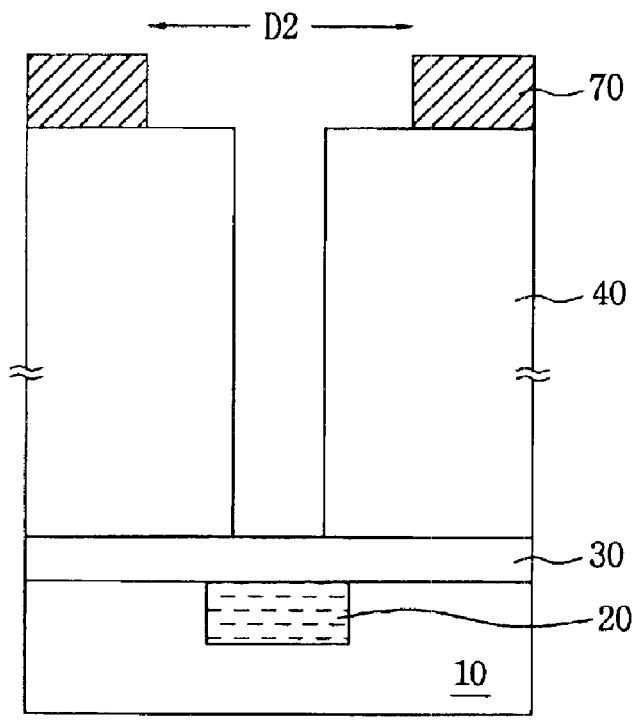
Figure 1D:
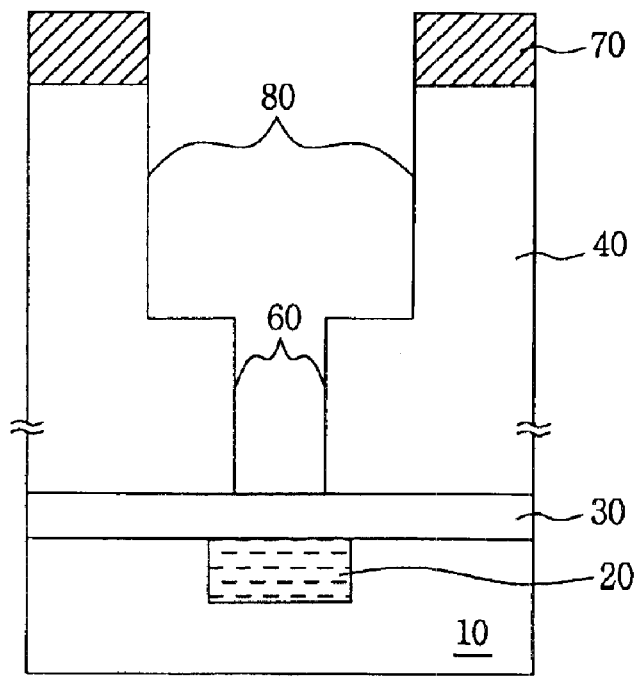
Figure 1E:
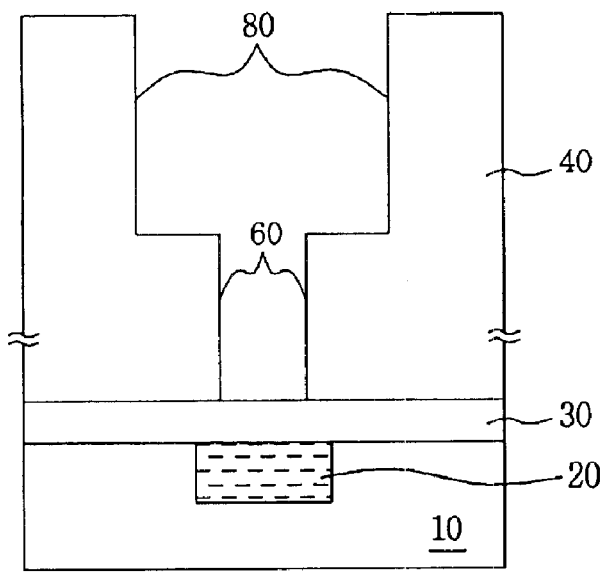
Figure 2A:
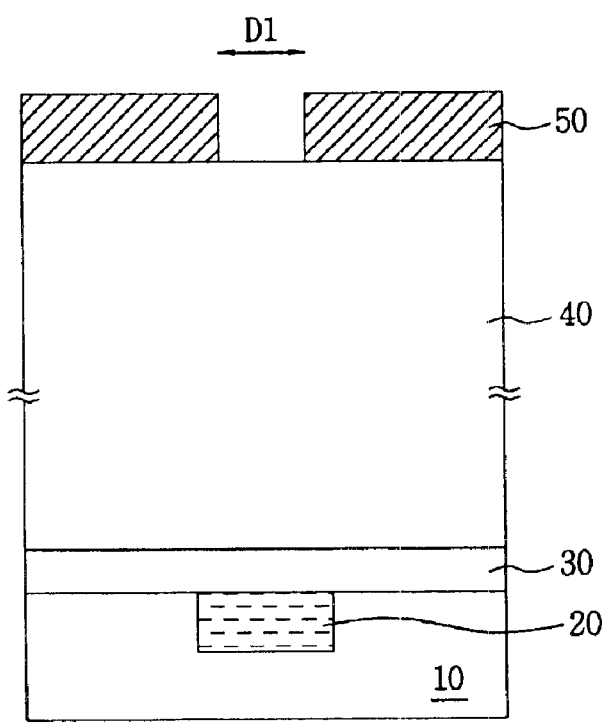
FIGS. 2A to 2F are sectional views of a second conventional dual damascene process.
Figure 2B:
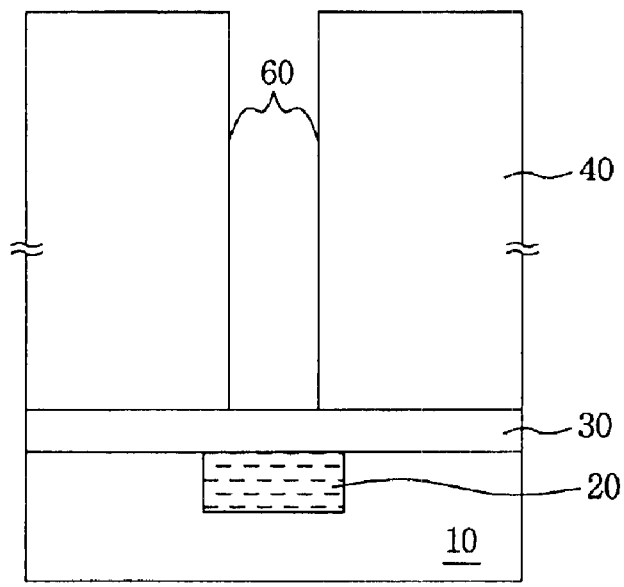
Figure 2C:
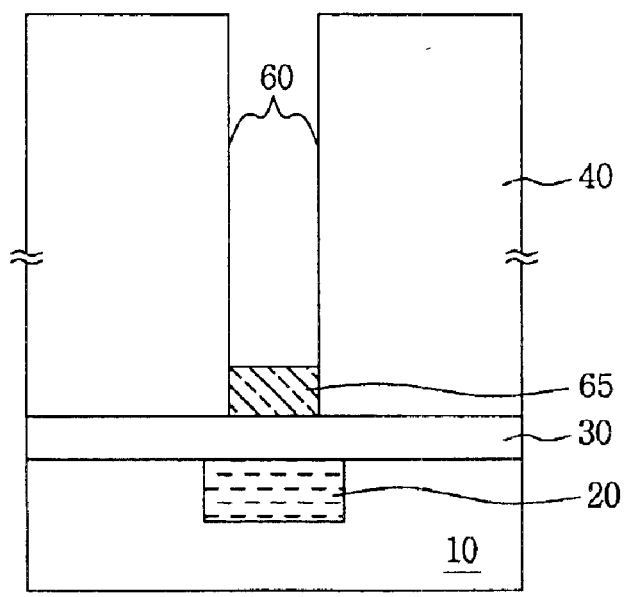
Figure 2D:
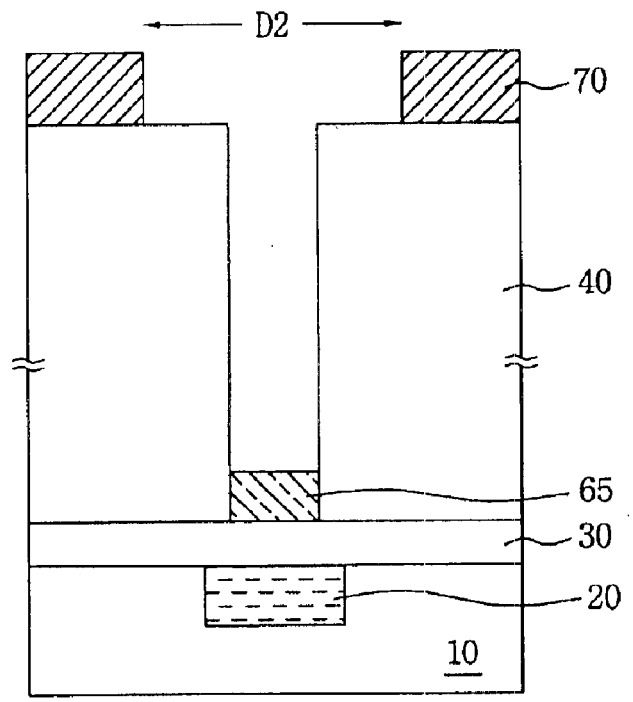
Figure 2E:
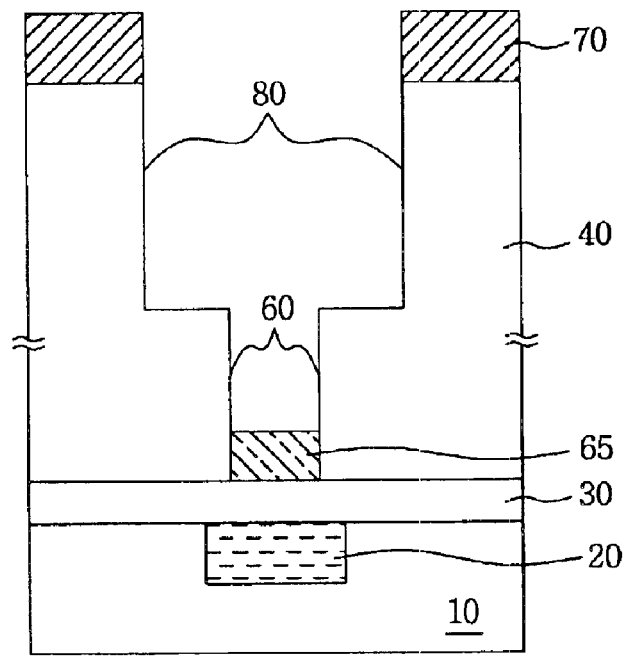
Figure 2F:
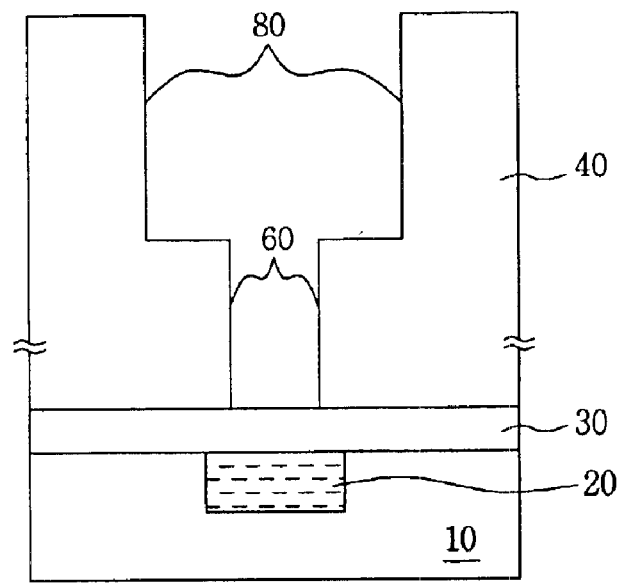
Figure 3A:
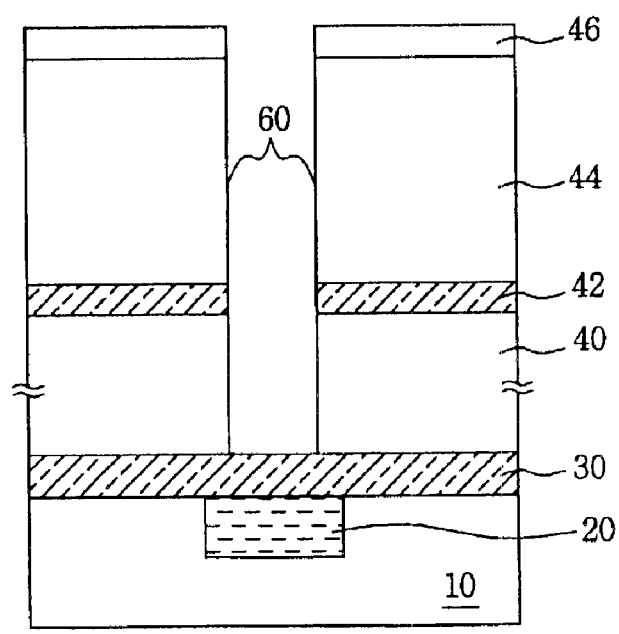
FIGS. 3A to 3F are sectional views dual damascene process using a sacrificial film in accordance with the present invention.

FIGS. 3A to 3F are sectional views illustrating the dual damascene process of the present invention that employs a sacrificial film. With reference to FIG. 3A, on a substrate 10 having a formation of an electric connection layer 20, it is sequentially formed an etch stop film 30 as a via etch stopper, a first interlayer dielectric film 40 made of SiOC:H group material, an etch stop film 42 as a trench etch stopper and an interlayer dielectric film 44 made of SiOC:H group material. On the interlayer dielectric film 44, a capping layer 46 is formed. A primary opening 60 functioning as a via hole is then created. Such processes provide the sectional structure of FIG. 3A.

Figure 3B:
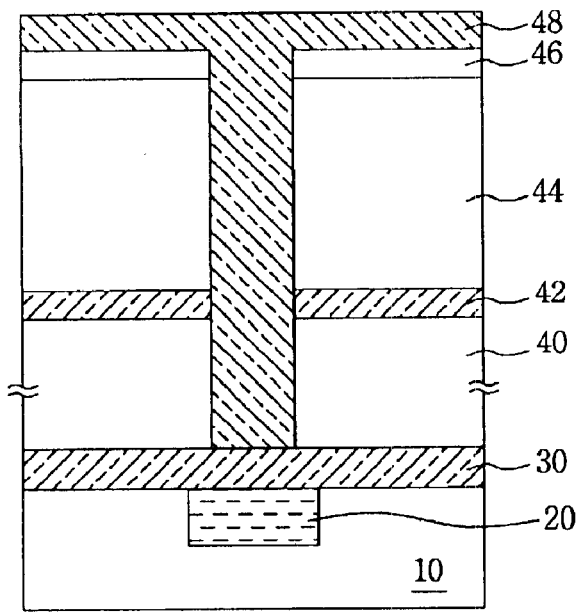

In FIG. 3B a sacrificial film 48 made of low dielectric constant material is provided to cover the resultant structure of FIG. 3A. The sacrificial film 48 can be created by wholly depositing a material, for example HSQ, through the use of a spin coating technique. Alternatively, the sacrificial film may be formed of MSQ or benzocyclobutene.

Figure 3C:
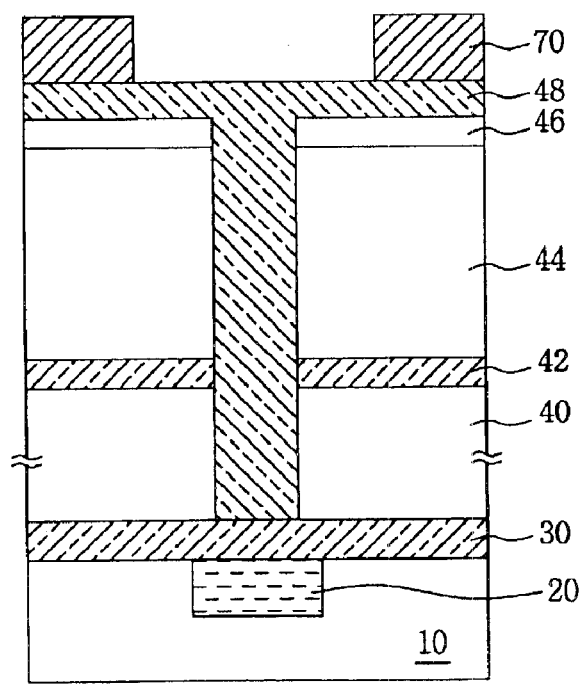
Figure 3D:
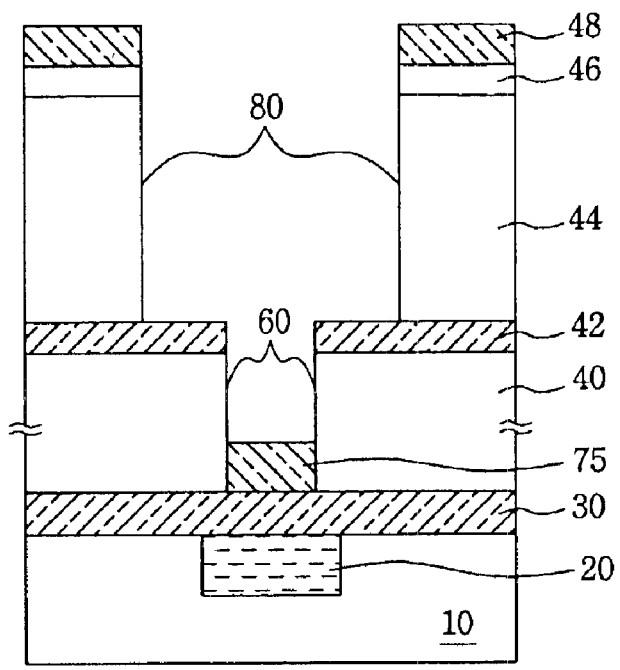

After forming the sacrificial film 48, a trench photoresist pattern 70 is formed, as shown in FIG. 3C. In FIG. 3D, the trench photoresist pattern 70 of FIG. 3C is used as an etch mask so as to perform a dry etch down to the trench etch stop layer 42, and then the pattern 70 is removed in an ashing process. As shown in FIG. 3D, a secondary opening 80 extends from the primary opening 60. In forming the secondary opening 80, the portion of the sacrificial film 48 that lies within the primary opening 60 becomes an etch stopper protective film 75, providing the function of the above-described conventional BARC film 65. At this time, if the etching speed condition of the sacrificial film 48 is matched so as to a little quicker than the etching speed of the interlayer dielectric film 44, the occurrence of a fence can be prevented.

Figure 3E:
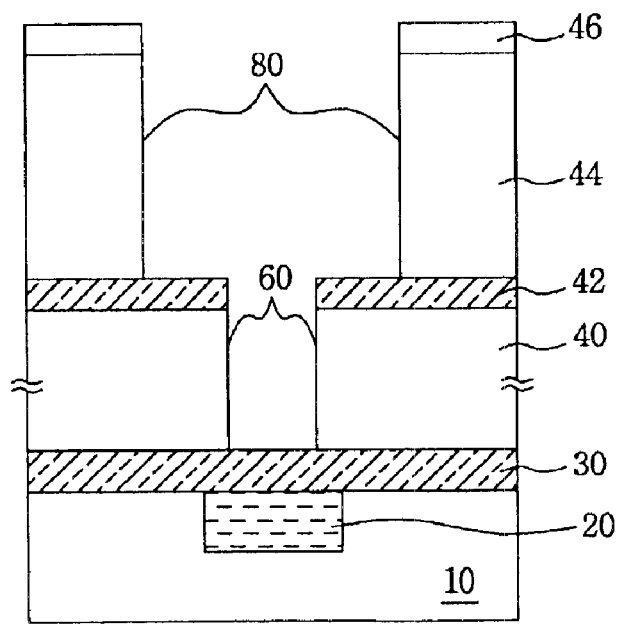
Figure 3F:
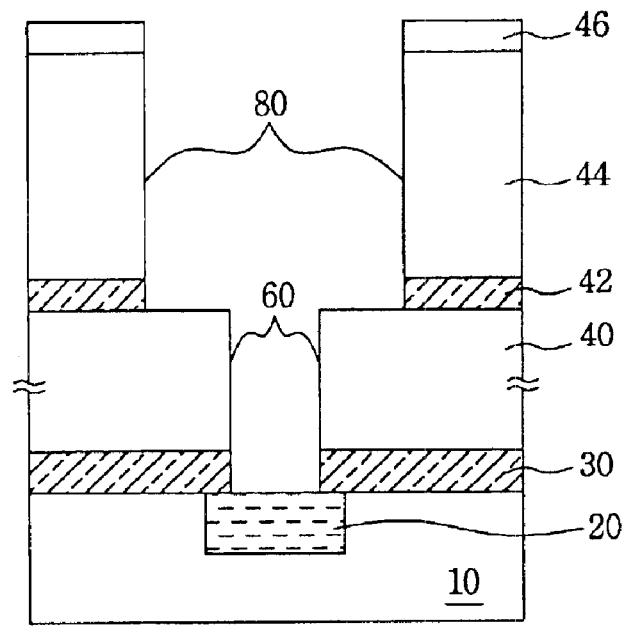

In FIG. 3E, the sacrificial film 48 remaining on the top surface and any residual sacrificial film 75 remaining in the via hole 60 are stripped using HF. Following this, the etch stop films 42, 30 exposed in the primary and secondary openings 60, 80 are etched as shown in FIG. 3F.

The above method offers a very good margin for the trench photo process since the trench photo process is performed on the flattened sacrificial film 48. This method also resolves the conventional problem of photoresist remaining inside the via hole that otherwise would cause a fence to occur. The HSQ material of the sacrificial layer 48 and the material of the ILD 44 further are of the same inorganic compound. Therefore, during the trench etch, there is little possibility of causing a fence if the etch rate of the HSQ of the sacrificial layer 48 is controlled so as to be a slightly quicker than the etch rate of the SiOC:H of the ILD 44. The HSQ is preferably a silicon oxide film containing a large amount of hydrogen, and its dielectric rate is about 2.9.

FIGS. 3A through 3F represent the dual damascene process using a sacrificial film in accordance with the present invention. However, it may be beneficial to alter the process for the reasons described below.

Figure 4A:
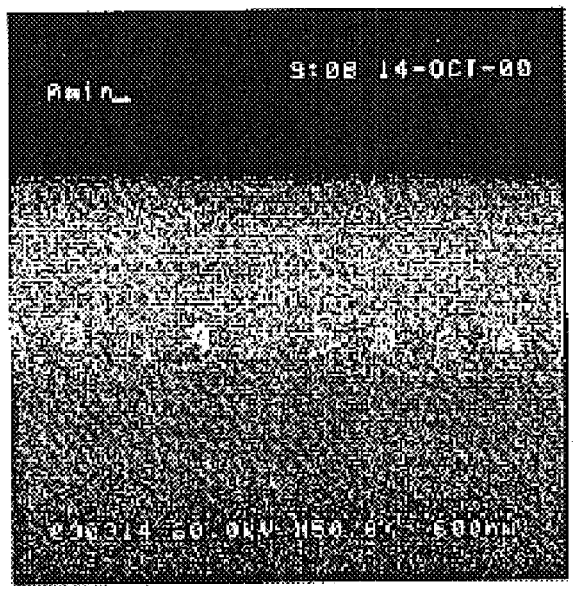
FIGS. 4A and 4B are electron microscope photographs showing a dissolving characteristic of a developing solution on a sacrificial film in the present invention.
Figure 4B:
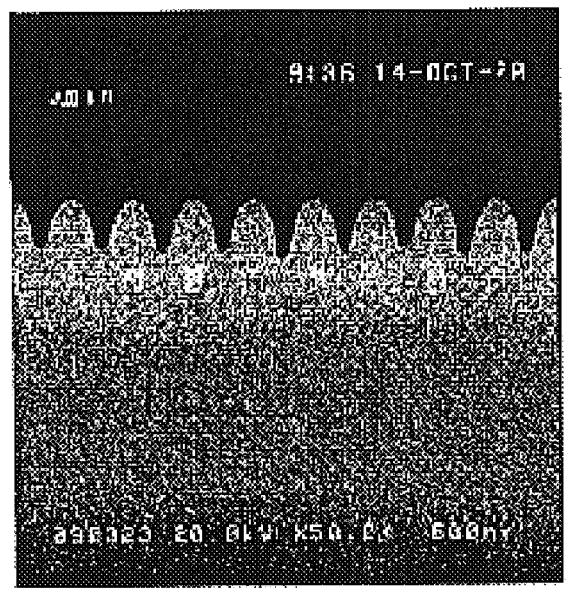

A first reason is that it is difficult to perform trench patterning directly on the HSQ. In a case where the HSQ film shown in FIG. 4A is dipped into photoresist developing solution for 5 minutes, its surface becomes rugged as shown in FIG. 4B. This is caused by the HSQ film being dissolved by the photoresist developing solution. Therefore, it is difficult to perform the photoresist patterning directly on the HSQ film. In order to overcome this, the present invention further provides for the following first, second and third embodiments.

As a second cause it is difficult to remove the HSQ film remaining after the trench etch. Such difficulty in removing the HSQ film will be explained below with reference to FIG. 10. The smooth removal of HSQ film will be described below with reference to FIGS. 8A–8C.

FIGS. 5A to 5E illustrate sectional views illustrating the the dual damascene process according to a first embodiment of the present invention.

Figure 5A:
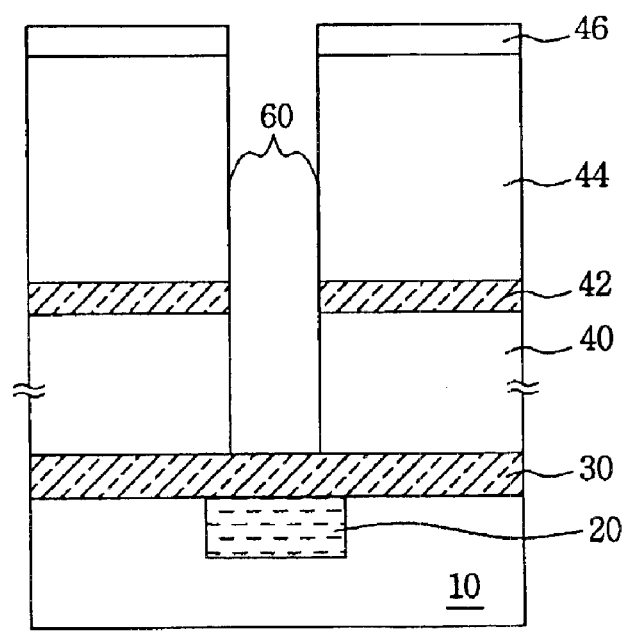
FIGS. 5A to 5E are sectional views illustrating a dual damascene process according to a first embodiment of the present invention.

In FIG. 5A, on a substrate 10 including an electrical connection layer 20, an etch stop film 30 as a via etch stopper, an interlayer dielectric film 40 made of SiOC:H group material, an etch stop film 42 as the trench etch stopper, and an interlayer dielectric film 44 made of SiOC:H group material are sequentially formed. On the interlayer dielectric film 44, an anti-reflection layer 46 is deposited. Then the primary opening 60 functioning as the via hole is created. Such processes provide the sectional structure of FIG. 5A. The anti-reflection layer 46 may, for example, comprise a capping layer capable of performing an ARL (Anti-Reflection Layer) function to prevent scattering of light rays during the photolithography process, or, alternatively, may comprise an organic ARC material. As an example, the material of the anti-reflection layer 46 may comprise SiON or SiC.

Figure 5B:
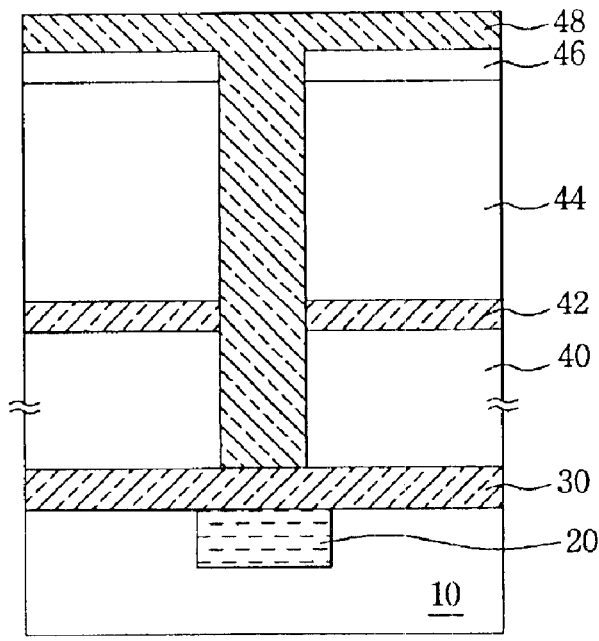

Referring to FIG. 5B, the sacrificial film 48 made of low dielectric constant material is provided on the resultant structure of FIG. 5A. The sacrificial film 48 can be formed, for example, by depositing, for example, HSQ, MSQ or Benzocyclobutene, via a spin coating technique.

Figure 5C:
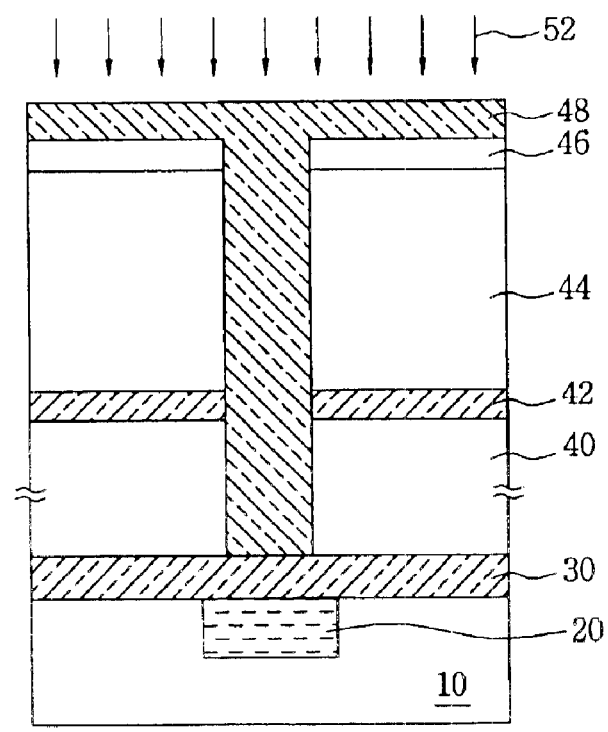

As shown in FIG. 5C, the upper surface of the sacrificial film 48 is plasma-processed (52) by using a source gas such as $O_2$, $N_2$, $NH_3$, He, $H_2$, and the like. The structure of the HSQ film 48 is densified as a result of the plasma-process. In this manner, the sacrificial film 48 is more resistant to attack by the photoresist developing solution, and photoresist patterning can therefore be readily performed on the post-process HSQ film 48.

Figure 5D:
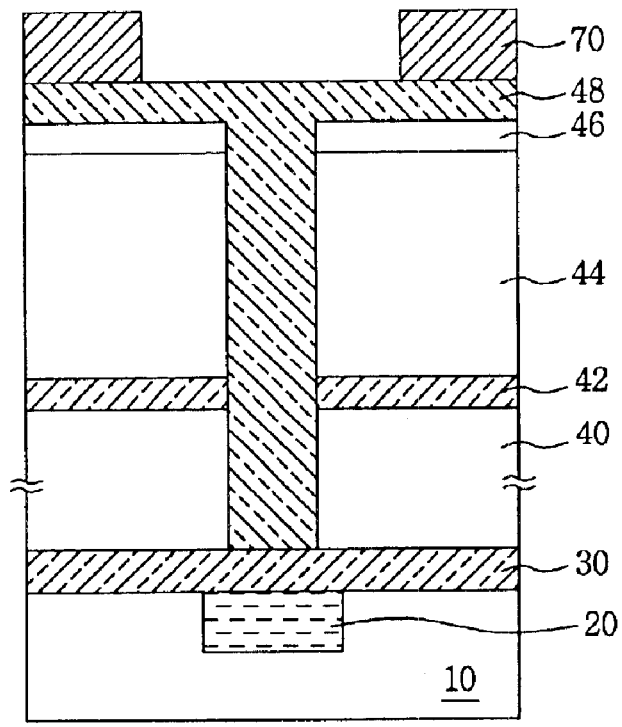

FIG. 5D illustrates the trench photoresist pattern 70 formed on the plasma-processed HSQ film 48. The HSQ film 48 may optionally be planarized before or after the aforementioned plasma-process. The planarization process is performed, for example, in a chemical mechanical polishing (CMP).

Figure 5E:
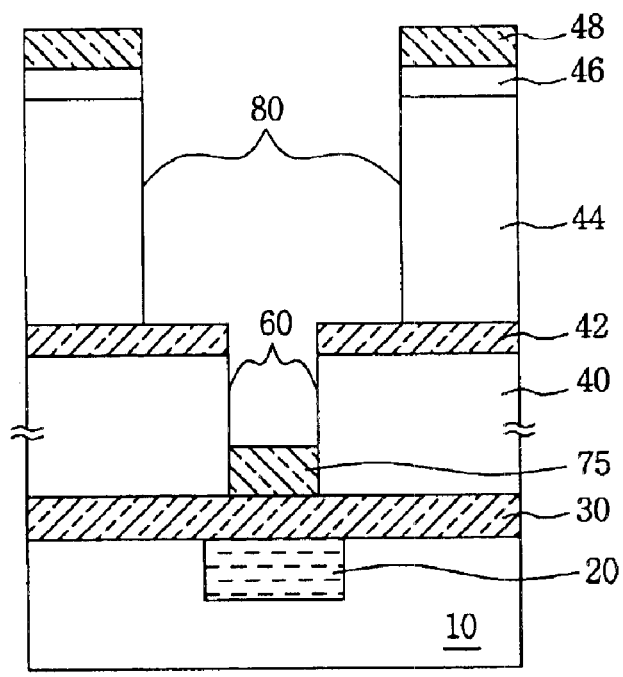

FIG. 5E illustrates the structure following a dry etch using the trench photoresist pattern 70 of FIG. 5D as an etch mask. The trench photoresist pattern 70 is removed by ashing. As shown in the drawing, the secondary opening 80 is formed as an extension of the primary opening 60. It is herewith desirable that a portion of the sacrificial film 48 remains and functions as an etch stopper protective film 75 at the bottom of the primary opening 60, until the secondary opening 80 is fully formed.

In the first embodiment described above, a plasma process was performed on the surface of the sacrificial HSQ film 48 and the trench photoresist pattern 70 is directly formed thereon thereon.

The post process of the structure of FIG. 5E will be explained below with reference to FIGS. 8A–8C.

Figure 6A:
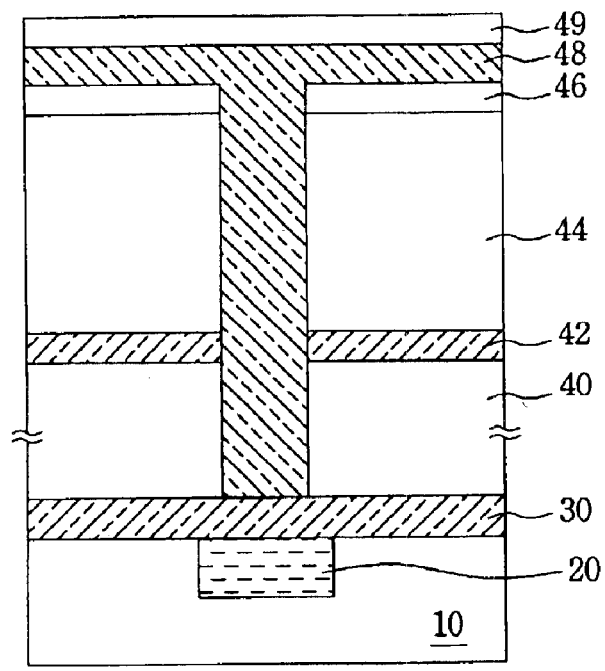
FIGS. 6A to 6C are sectional views illustrating a dual damascene process according to a second embodiment of the present invention.
Figure 6B:
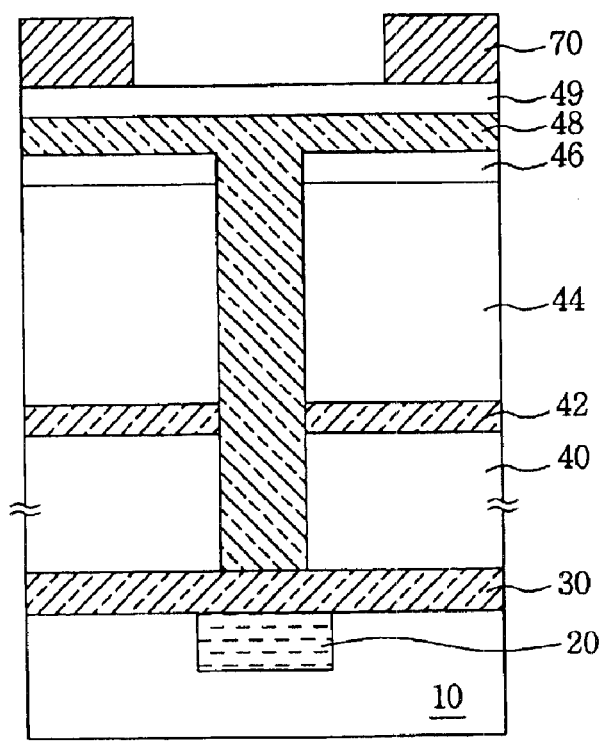
Figure 6C:
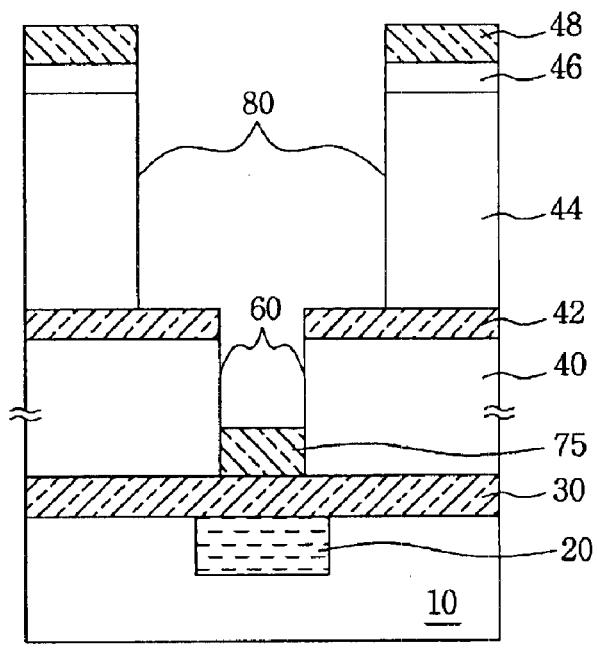

FIGS. 6A to 6C are sectional views illustrating the dual damascene process according to a second embodiment of the present invention.

FIG. 6A illustrates a capping thin film 49 deposited on the resultant structure of FIG. 5B. The capping thin film 49 can, for example, be formed as a thin oxide film having a thickness of about several decades of angstrom. FIG. 6B illustrates formation of the trench photoresist pattern 70 on the capping thin film 49.

FIG. 6C illustrates the resulting structure after the trench photoresist pattern 70 of FIG. 6B is used as an etch mask to perform the dry etch, the pattern 70 is removed by ashing, and the thin capping film 49 is removed in the etch back process.

In the second embodiment, the thin capping film 49 is formed on the HSQ sacrificial 48 film prior to formation of the trench photoresist pattern 70. The post processing of the structure of FIG. 6C will likewise be described below with reference to FIGS. 8A–8C.

Figure 7A:
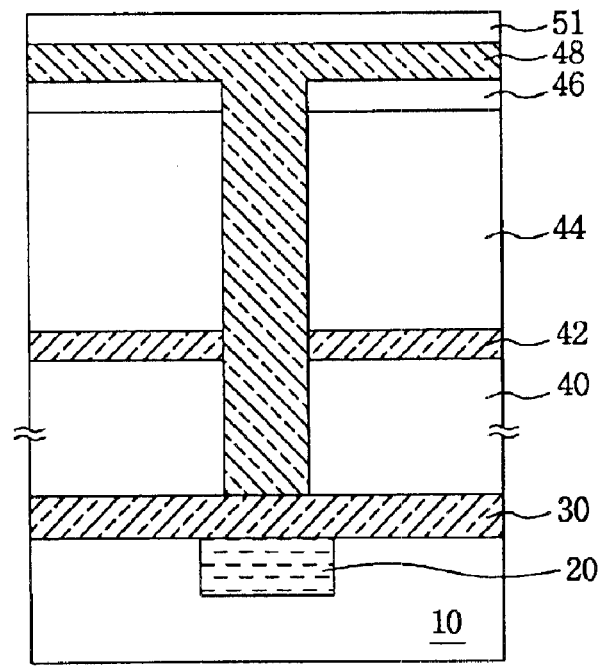
FIGS. 7A and 7B are sectional views illustrating a dual damascene processes according to a third embodiment of the present invention.
Figure 7B:
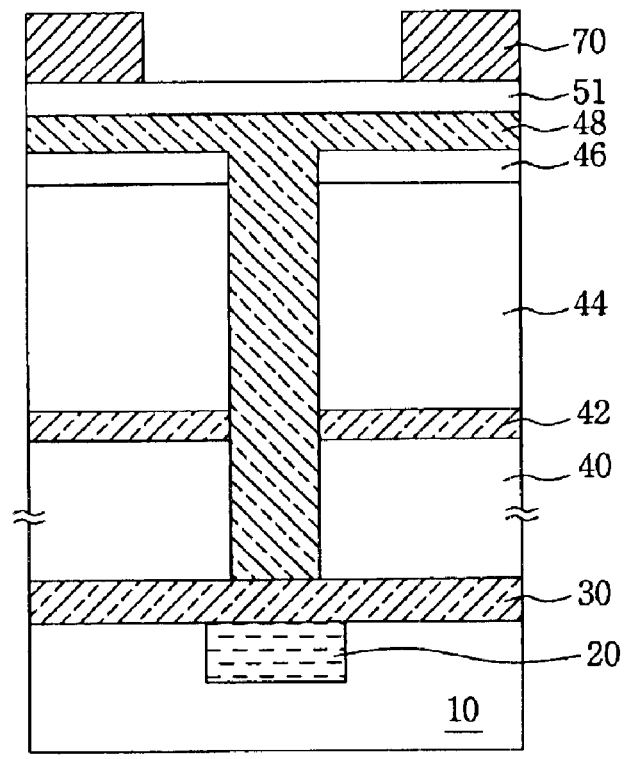

FIGS. 7A and 7B are sectional views illustrating the dual damascene process according to a third embodiment of the present invention. FIG. 7A represents a formation of an anti-reflection coating film 51 on the resultant structure of FIG. 5B. The anti-reflection coating film 51 is, for example, made of a thin organic or inorganic material capable of being used as ARC, and, for example, can be formed by dual coating. That is, since the anti-reflection coating film 51 doesn't have reactivity to the photoresist developing solution, the anti-reflection coating film 51 is deposited directly on the HSQ sacrificial film 48. FIG. 7B illustrates formation of the trench photoresist pattern 70 on the anti-reflection coating film 51.

In the third embodiment, a second anti-reflection coating film 51 is formed on the HSQ sacrificial film 48, and the trench photoresist pattern 70 is then formed. Post processing of the structure of FIG. 7B will be explained below with reference to FIGS. 8A–8C.

Figure 8A:
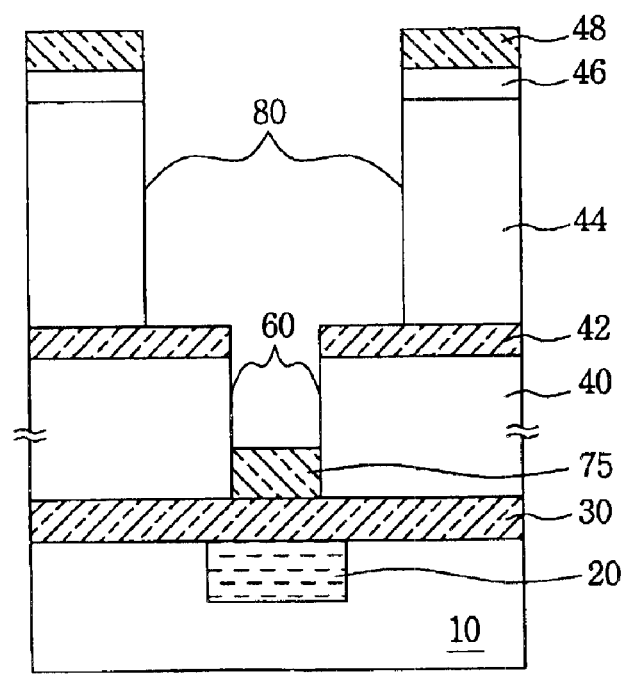
FIGS. 8A to 8C are sectional views illustrating the removal of residual sacrificial film in a dual damascene process of the present invention.
Figure 8B:
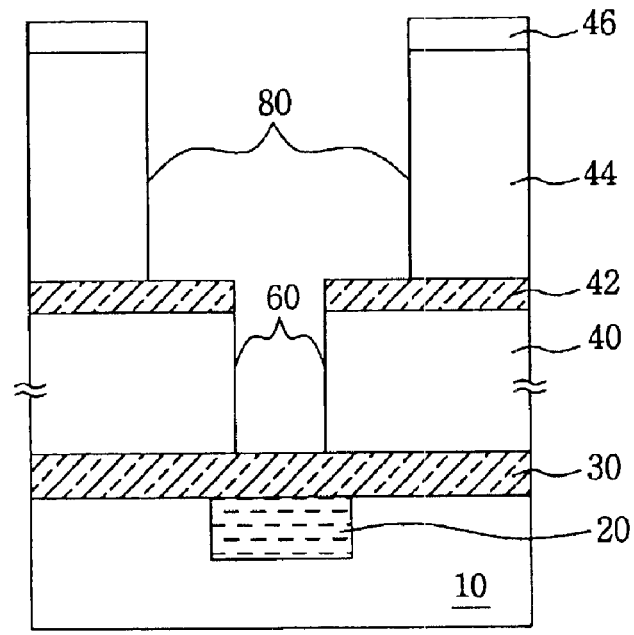
Figure 8C:
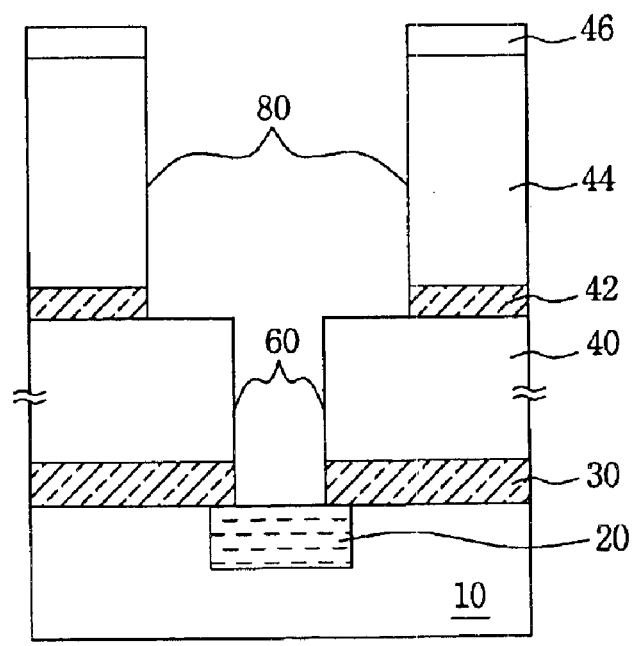

FIGS. 8A to 8C are sectional views illustrating the process for removal of the residual sacrificial film in the dual damascene process of the present invention.

Figure 10:
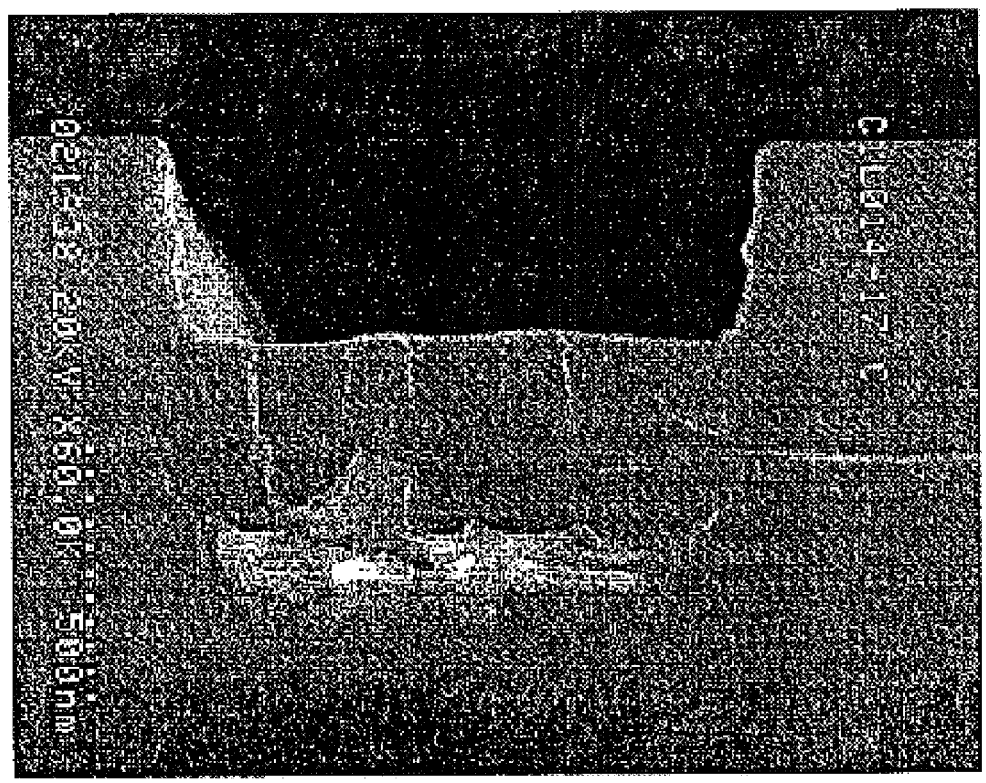
FIG. 10 is an electron microscope photograph illustrating the occurrence of undercut or profile defect associated with the elimination of residual sacrificial film by a wet etching method.

It general, wet etching using a solvent of a fluorine group is commonly used in order to eliminate the residual HSQ films 48, 75 shown in FIG. 8A following the trench etch and ashing processes. However, in the case of using such wet etching, an undercut and profile defect may be caused as shown in FIG. 10. FIG. 10 is an electron microscope photograph that illustrates the problems caused when the residual sacrificial film utilized in the present invention is removed by the wet etching method. The photograph of FIG. 10 shows an interface attack caused by a difference in wet etch rate between layers. It is visible in FIG. 10 that the side wall and lower part thereof are not straight and are hollowed out.

In the embodiment of present invention, therefore, the residual HSQ film 48, 75 is removed by the dry etch back process. In this method, the films 46,44,42,40,30 have a prominent selection rate of the dry etch against the HSQ film; thus, these films are used as the etch mask in this process. The dry etch back process is executed by using the films as the etch mask to thus gain the structure illustrated in FIG. 8B. FIG. 8C shows the resultant structure following etching of the trench etch stop film 42 and the via etch stop film 30. In this manner, when the residual sacrificial HSQ film 48, 75 is removed by the dry etch back process based on the inventive preferred embodiment, profile defects, or undercut, is minimized. Following this, the primary and secondary openings 60, 80 are filled with metal so as to be electrically coupled with the lower electrical connection layer 20.

Figure 9A:
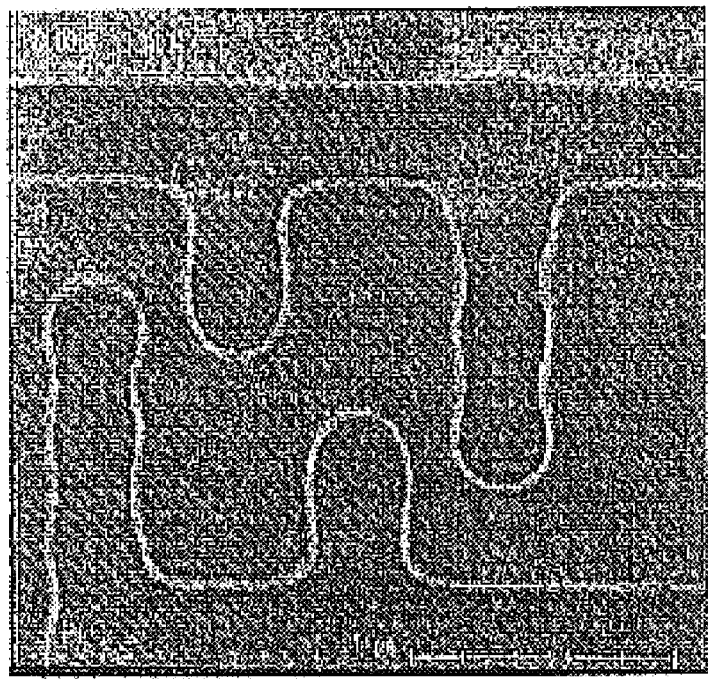
FIGS. 9A to 9C are electron microscope photographs showing patterning resultants in the first, second and third embodiments of the present invention.
Figure 9B:
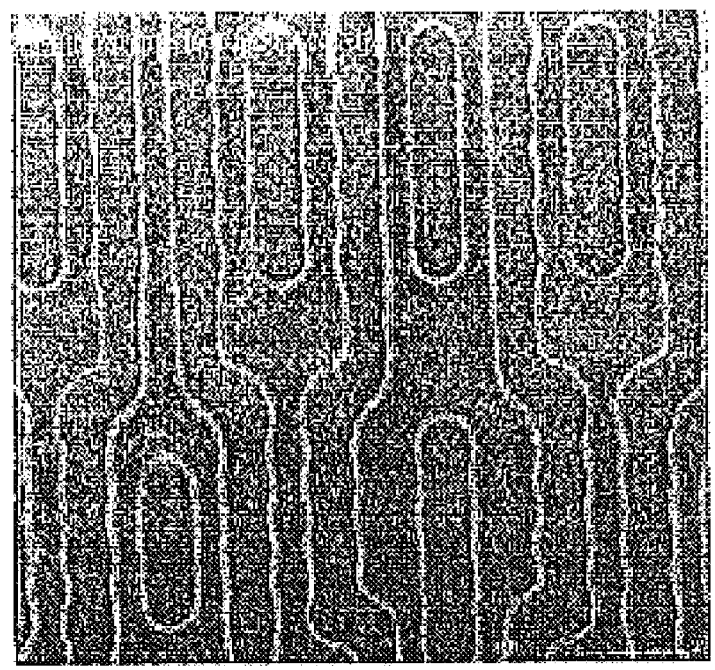
Figure 9C:
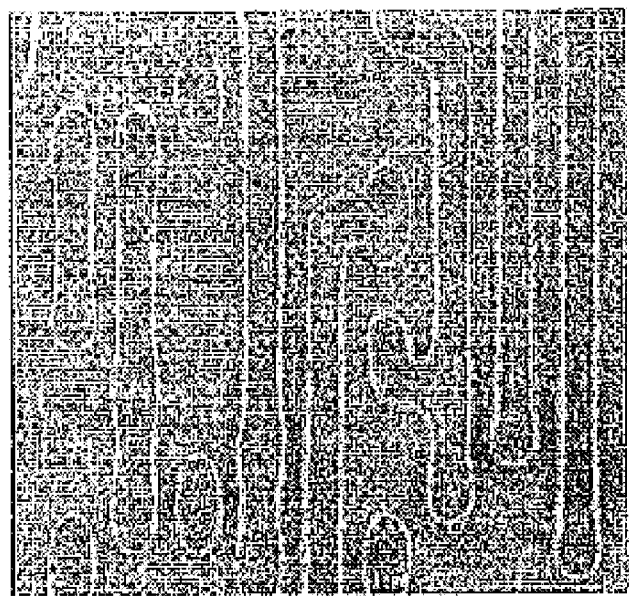

FIGS. 9A through 9C illustrate, for reference, electron microscope photographs showing each of the resultants of the trench patterning in the first, second and third embodiments of the present invention. FIG. 9A represents a plane face following the coating of HSQ film and the plasma process. FIG. 9B is a plane face following formation of the thin oxide film on the HSQ film. FIG. 9C is a plane face following formation of a double coating capable of being used as HSQ and ARC, and following execution of the trench patterning.

As described above, in accordance with the present invention, there is an advantage of preventing or minimizing damage to an etch stop layer via a smooth photolithography process, in forming a dual damascene wiring pattern. There further is an advantage of effectively eliminating a sacrificial film remaining after a trench etch, in forming the dual damascene wiring pattern by using the sacrificial film made of low dielectric constant material.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, the thicknesses of the respective layers and detailed process conditions can be variously modified or changed, depending on the application.

What is claimed is:

1. A method of forming a dual damascene wiring pattern, comprising the steps of:

forming an etch stop film and an interlayer dielectric film comprising an SiOC:H group material on a substrate having an electrical connection layer formed thereon;

forming an anti-reflection layer on the interlayer dielectric film;

forming a primary opening by etching the anti-reflection layer and the interlayer dielectric film to expose a surface of the etch stop film;

forming a sacrificial film comprising a low dielectric constant material in the primary opening and on the anti-reflection layer;

plasma-processing the sacrificial film to densify the sacrificial film;

forming a trench photoresist pattern having a width larger than that of the primary opening on the sacrificial film after plasma-processing the sacrificial film;

sequentially etching the sacrificial film, the anti-reflection layer and the interlayer dielectric film using the trench photoresist pattern as an etch mask so as to form a secondary opening of a trench shape, and removing the trench photoresist pattern, said secondary opening extending from an upper portion of the primary opening; and removing the sacrificial film remaining, removing the exposed etch stop film and anti-reflection layer, and filling the primary and secondary openings with metal so as to be electrically coupled with the electrical connection layer.

2. The method of claim 1, wherein said step of removing the sacrificial film is performed by a dry etch back process.

3. The method of claim 1, wherein said electrical connection layer comprises copper.

4. The method of claim 1, wherein said sacrificial film comprises hydrogen silsesquioxane(HSQ).

5. The method of claim 1, wherein said sacrificial film comprises methyl silsesquioxane(MSQ) MSQ.

6. The method of claim 1, wherein said sacrificial film comprises benzocyclobutene.

7. The method of claim 1, wherein plasma-processing said sacrificial film is performed by using, as plasma source gas, a mixed gas comprising at least one of oxygen, nitrogen, ammonia, helium and hydrogen.

8. The method of claim 1, wherein said etch stop film comprises SiC or SiN.

9. The method of claim 1, wherein said anti-reflection layer comprises SiC or SiON.

10. A method of forming a dual damascene wiring pattern, comprising the steps of:

forming an etch stop film and an interlayer dielectric film comprising an SiOC:H group material on a substrate having an electrical connection layer formed thereon;

forming an anti-reflection layer on the interlayer dielectric film;

forming a primary opening by etching the anti-reflection layer and the interlayer dielectric film to expose a surface of the etch stop film;

forming a sacrificial film comprising a low dielectric constant material in the primary opening and on the anti-reflection layer;

forming a capping thin film on a portion of the sacrificial film that is over the anti-reflection layer, and forming a trench photoresist pattern having a width larger than that of the primary opening on the capping thin film;

sequentially etching the capping thin film, the sacrificial film, the anti-reflection layer and the interlayer dielectric film using the trench photoresist pattern as an etch mask so as to form a secondary opening of a trench shape, and removing the trench photoresist pattern, said secondary opening extending from an upper portion of the primary opening; and removing the remaining capping thin film and the remaining sacrificial film, removing the exposed etch stop film and anti-reflection layer, and filling the primary and secondary openings with metal so as to be electrically coupled with the electrical connection layer.

11. The method of claim 10, wherein the step of removing the sacrificial film is performed by a dry or wet etch back process.

12. The method of claim 10, wherein said capping thin film comprises an oxide film or an inorganic reflection preventing film.

13. The method of claim 10, wherein the sacrificial film comprises hydrogen silsesquioxane(HSQ).

14. A method of forming a dual damascene wiring pattern, comprising the steps of:

forming an etch stop film and an interlayer dielectric film comprising an SiOC:H group material on a substrate having an electrical connection layer formed thereon;

forming an anti-reflection layer on the interlayer dielectric film;

forming a primary opening by etching the anti-reflection layer and the interlayer dielectric film to expose a surface of the etch stop film;

forming a sacrificial film comprising a low dielectric constant material in the primary opening and on the anti-reflection layer;

forming an anti-reflection coating film on a portion of the sacrificial film that is over the anti-reflection layer, and forming a trench photoresist pattern having a width larger than that of the primary opening on the anti-reflection coating film;

sequentially etching the anti-reflection coating film, the sacrificial film, the anti-reflection layer and the interlayer dielectric film using the trench photoresist pattern as an etch mask so as to form a secondary opening of a trench shape, and removing the trench photoresist pattern, said secondary opening extending from an upper portion of the primary opening; and removing the remaining anti-reflection coating film and the remaining sacrificial film, removing the exposed etch stop film and anti-reflection layer, and filling the primary and secondary openings with metal so as to be electrically coupled with the electrical connection layer.

15. The method of claim 14, wherein said step of removing the sacrificial film is performed by a dry or wet etch back process.

16. The method of claim 14, wherein said electrical connection layer comprises copper.

17. The method of claim 14, wherein said sacrificial film comprises hydrogen silsesquioxane(HSQ).

18. The method of claim 14, wherein said anti-reflection coating film comprises an organic coating thin film.

* * * * *